US011373092B2

United States Patent
Piveteau et al.

(10) Patent No.: US 11,373,092 B2
(45) Date of Patent: Jun. 28, 2022

(54) TRAINING OF ARTIFICIAL NEURAL NETWORKS

(71) Applicant: International Business Machines Corporation, Armonk, NY (US)

(72) Inventors: Christophe Piveteau, Zurich (CH); Abu Sebastian, Adliswil (CH); Manuel Le Gallo-Bourdeau, Zurich (CH); Vinay Manikrao Joshi, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 749 days.

(21) Appl. No.: 16/380,312

(22) Filed: Apr. 10, 2019

(65) Prior Publication Data
US 2020/0327406 A1 Oct. 15, 2020

(51) Int. Cl.
*G06N 3/08* (2006.01)
*G11C 13/00* (2006.01)
*G06N 7/00* (2006.01)

(52) U.S. Cl.
CPC ............. *G06N 3/08* (2013.01); *G06N 7/005* (2013.01); *G11C 13/0004* (2013.01); *G11C 13/0069* (2013.01)

(58) Field of Classification Search
CPC ........ G06N 3/08; G06N 7/005; G06N 3/0635; G06N 3/084; G11C 13/0004; G11C 13/0069; G11C 13/0007; G11C 11/54
USPC .......................................................... 706/21
See application file for complete search history.

(56) References Cited

U.S. PATENT DOCUMENTS

| 2015/0170025 | A1  | 6/2015  | Wu et al. |
| 2016/0342904 | A1* | 11/2016 | Merkel ............... G06N 3/0635 |
| 2019/0244088 | A1* | 8/2019  | Yang ..................... G06N 3/061 |

FOREIGN PATENT DOCUMENTS

| WO | 2010151247 A1 | 12/2010 |
| WO | 2017138951 A1 | 8/2017 |
| WO | 2017155544 A1 | 9/2017 |

OTHER PUBLICATIONS

Nandakumar, S.R., et al., "Mixed-precision training of deep neural networks using computational memory", arXiv:1712.01192v1, Dec. 4, 2017, 9 pages.

(Continued)

*Primary Examiner* — Fitwi Y Hailegiorgis
(74) *Attorney, Agent, or Firm* — Scully, Scott, Murphy & Presser, P.C.; Daniel P. Morris

(57) ABSTRACT

Methods are provided for training weights of an artificial neural network to be implemented by inference computing apparatus in which the trained weights are stored as programmed conductance states of respective predetermined memristive devices. Such a method includes deriving for the memristive devices a probability distribution indicating distribution of conductance errors for the devices in the programmed conductance states. The method further comprises, in a digital computing apparatus: training the weights via an iterative training process in which the weights are repeatedly updated in response to processing by the network of training data which is propagated over the network via the weights; and applying noise dependent on said probability distribution to weights used in the iterative training process.

20 Claims, 6 Drawing Sheets

(56) References Cited

OTHER PUBLICATIONS

Courbariaux, M., et al., "BinaryConnect: Training Deep Neural Networks with binary weights during propagations", arXiv:1511.00363v3, Apr. 18, 2016, 9 pages.
Murray, A.F., et al., "Enhanced MLP Performance and Fault Tolerance Resulting from Synaptic Weight Noise During Training", IEEE Transactions on Neural Networks, Sep. 1994, pp. 792-802, vol. 5, No. 5.
Yang, Q., et al., "A Quantized Training Method to Enhance Accuracy of ReRAM-based Neuromorphic Systems", 2018 IEEE International Symposium on Circuits and Systems (ISCAS), May 27-30, 2018, 5 pages.
Song, C., et al., "A Quantization-aware Regularized Learning Method in Multilevel Memristor-based Neuromorphic Computing System", 2017 IEEE 6th Non-Volatile Memory Systems and Applications Symposium (NVMSA), Aug. 2017, 6 pages.
Chen, L., et. al., "Accelerator-friendly Neural-network Training: Learning Variations and Defects in RRAM Crossbar", 2017 Design, Automation and Test in Europe (DATE), Mar. 2017, pp. 19-24.
Liu, B., et al., "Vortex: Variation-aware Training for Memristor X-bar", DAC '15, Jun. 7-11, 2015, 6 pages.
Baskin, C., et al., "UNIQ: Uniform Noise Injection for Non-Uniform Quantization of Neural Networks", arXiv:1804.10969v3, Oct. 2, 2018, 10 pages.
Mckinstry, J.L., et. al., "Discovering Low-Precision Networks Close to Full-Precision Networks for Efficient Embedded Inference", arXiv:1809.04191v2, Feb. 25, 2019, 11 pages.
Boybat, I., et al., "Neuromorphic computing with multi-memristive synapses", Nature Communications, vol. 9 (2018), arXiv:1711.06507v2, 16 pages.

\* cited by examiner

TRAINING OF ARTIFICIAL NEURAL NETWORKS

BACKGROUND

The present disclosure relates generally to training of artificial neural networks, and more particularly to training weights of such networks for network implementations in which the weights are stored as programmed conductance states of memristive devices.

Artificial neural networks (ANNs) have been developed to perform computational tasks in a manner inspired by biological architectures of the nervous system. These networks are based on a fundamental principle of biological systems whereby neurons are interconnected via synapses which relay weighted signals between the neurons. ANNs are based on a logical construction in which a succession of layers of neurons are interconnected so that output signals of neurons in one layer are weighted and transmitted to neurons in the next layer. A neuron $N_i$ in a given layer may be connected to one or more neurons $N_j$ in the next layer, and different weights $w_{ij}$ can be associated with each neuron-neuron connection $N_i$-$N_j$ for weighting signals transmitted from $N_i$ to $N_j$. A neuron $N_j$ generates output signals dependent on its accumulated inputs, whereby weighted signals can be propagated over successive layers of the network from an input to an output neuron layer.

ANNs have been successfully applied in various complex analysis tasks such as speech and image recognition, e.g. classification of hand-written digits. An ANN undergoes a training phase in which the sets of weights associated with respective network layers are determined. The network is exposed to a set of training data, e.g. image data for hand-written digits, in an iterative training process in which the weights are repeatedly updated as the network "learns" from the training data. Training involves an iterative cycle of signal propagation and weight-update calculation operations, with the network weights being progressively updated until a convergence condition is achieved. The resulting trained network, with weights defined via the training operation, can then be applied to new (unseen) data to perform inference tasks for the application in question.

Training of ANNs, which may have multiple neuron layers and millions of synaptic weights, is a compute- and time-intensive task. Powerful computing apparatus, typically using multi-core CPUs (central processing units), often with accelerators such as GPUs (graphics processing units) and FPGAs (field-programmable gate arrays), is usually employed for training.

ANN inference operations involve multiple vector-matrix computations to compute the signals propagated over the neuron layers, via the weights, in response to the network input data. Analog memristive crossbar arrays offer inexpensive vector-matrix computation engines with O(1) computational complexity and low power consumption. The inference process can be directly mapped to such analog memory arrays in which the ANN weights are stored as programmed conductance states of respective memristive devices. Various memristive devices are known in the art, e.g. based on resistive memory cells such as phase-change memory (PCM) cells. Due to their high speed and low power consumption, these memory arrays are attractive candidates for implementing ANN inference apparatus, and especially for deep-learning inference engines involving computations over multiple ANN layers. Training can be performed using digital computing apparatus in the usual manner, and the trained weights can then be transferred to memory arrays of the inference computing apparatus.

The transfer of digitally-trained weights to memristive devices turns out to be a challenging problem. The effective resolution of a typical memristive device is roughly five bits, corresponding to about $2^5$ distinguishable programmed conductance states. Transferring weights trained with full digital precision (e.g. 32- or 64-bit floating point precision) to memristive device arrays leads to a drastic reduction in accuracy. Moreover, programming of memristive devices is a strongly stochastic process due to conductance fluctuations. Conductance values can vary, for example, due to device variability, programming variations, device defects, and variations in conductance over time, e.g. due to so-called "drift" inherent in some memristive device technologies.

There have been various attempts to address aspects of quantization errors or device variations when training ANN weights for memristive arrays. However, inaccuracy due to transfer of digitally-trained ANN weights to memristive devices remains.

SUMMARY

According to at least one embodiment of the present invention there is provided a method for training weights of an artificial neural network to be implemented by inference computing apparatus in which the trained weights are stored as programmed conductance states of respective predetermined memristive devices. The method includes deriving for the memristive devices a probability distribution indicating distribution of conductance errors for the devices in the programmed conductance states. The method further comprises, in a digital computing apparatus: training the weights via an iterative training process in which the weights are repeatedly updated in response to processing by the network of training data which is propagated over the network via the weights; and applying noise dependent on said probability distribution to weights used in the iterative training process.

In methods embodying the invention, the noise applied to weights in the training process is dependent on a probability distribution, indicating distribution of conductance errors, which is derived for the predetermined memristive devices to be used in the inference computing apparatus. In this way, random errors are incorporated in the training process to reflect the particular conductance error distribution of the memristive devices in question. Imprecision resulting from storing the trained weights in memristive devices of the inference apparatus is thus incorporated in the training process, providing exceptional accuracy in training ANNs for implementation with memristive device arrays. Embodiments of the invention offer training methods in which network accuracy on the inference hardware is exactly the same as accuracy of the digital network trained with these methods.

In one embodiment, the probability distribution for the memristive devices can be derived by performing conductance measurements on test memristive devices and deriving the probability distribution from the conductance measurements. Ideally, the test devices are the same type of device as the predetermined devices of the inference apparatus. More particularly, the conductance measurements can be performed on the predetermined memristive devices in said programmed conductance states. Performing the conductance measurements on the same type of device, in programmed conductance states used for weight storage, enhances accuracy of the resulting probability distribution. Measurements may be performed on devices in a crossbar array, corresponding to crossbar arrays of the inference apparatus, to accommodate any variations due to particular circuit configurations. However, derivation of the probability distribution may involve at least some degree of modelling as discussed further below.

In embodiments, the conductance measurements are performed on the test devices in a test environment providing a set of environmental conditions present in an operating environment of the inference computing apparatus. This provides a probability distribution accommodating conductance-errors obtained under operating conditions of the inference apparatus, such as particular temperature, pressure and/or motion conditions. Training of the weights is thereby tailored to a particular application scenario for exceptional accuracy during inference.

The probability distribution may be a function of programmed conductance state of the memristive devices. In this case, noise applied to a weight in the iterative training process is dependent on a programmed conductance state corresponding to that weight. This accommodates specific conductance-error distributions associated with individual programmed states. Further, the probability distribution may be a function of time in embodiments. In these embodiments, a time distribution for operation of the inference computing apparatus is defined in the digital computing apparatus. Noise is applied to a weight by sampling a time from this time distribution and then applying noise dependent on the probability distribution at the sampled time.

Noise is conveniently applied to a weight by adding a noise sample $\Delta w = \alpha \Delta G$, where $\Delta G$ is a conductance error sampled from the probability distribution and $\alpha$ is a scaling factor. The scaling factor $\alpha$ can be tailored to particular network layers, and can be made adaptive to evolution of weight ranges during training as explained further below.

In embodiments, training methods can include, in the digital computing apparatus: pre-training the weights via a network training process, without applying said noise to the weights, to obtain pre-trained weights for the network; and further training the pre-trained weights via said iterative training process in which the noise is applied to the weights. The noise-based training is thus applied as a fine-tuning stage to enhance overall performance.

At least one further embodiment of the invention provides a computer program product comprising a computer readable storage medium embodying program instructions, executable by digital computing apparatus, to cause the digital computing apparatus to: store a probability distribution derived for said memristive devices, the probability distribution indicating distribution of conductance errors for said devices in said programmed conductance states; train the weights via an iterative training process in which the weights are repeatedly updated in response to processing by the network of training data which is propagated over the network via the weights; and apply noise dependent on said probability distribution to weights used in the iterative training process.

Embodiments of the invention will be described in more detail below, by way of illustrative and non-limiting example, with reference to the accompanying drawings.

DETAILED DESCRIPTION

Figure 1:
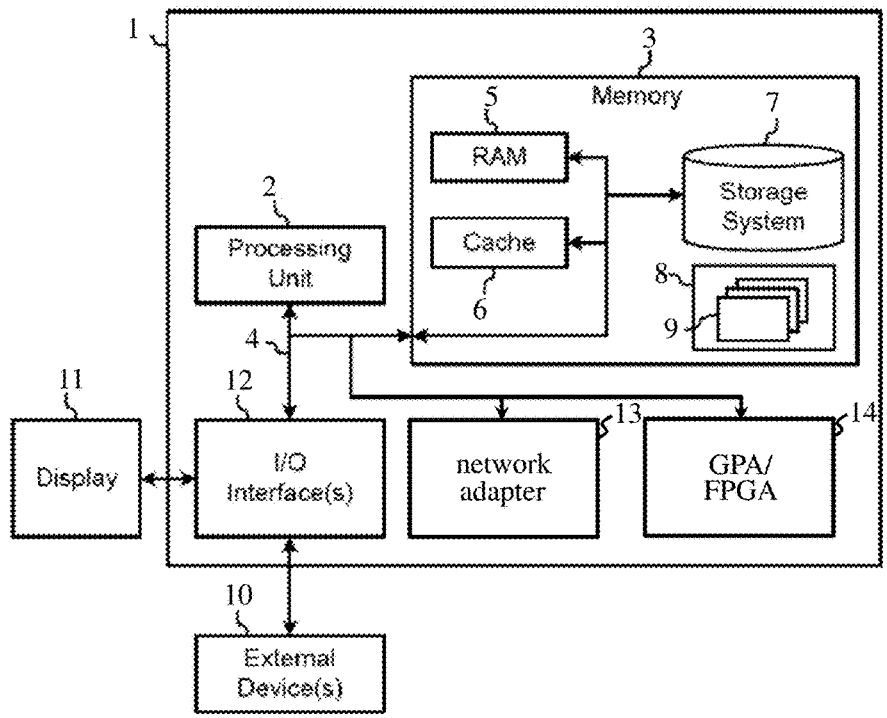
FIG. 1 is a schematic representation of computing apparatus for implementing embodiments of the invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Embodiments of the invention provide methods for training weights of an artificial neural network. Such methods can be implemented by digital computing apparatus comprising one or more general- or special-purpose computers, each of which may comprise one or more (real or virtual) machines, providing functionality for implementing operations described herein. Steps of methods embodying the invention may be implemented by program instructions, e.g. program modules, implemented by a processing device of the apparatus. Generally, program modules may include routines, programs, objects, components, logic, data structures, and so on that perform particular tasks or implement particular abstract data types. The computing apparatus may be implemented in a distributed computing environment, such as a cloud computing environment, where tasks are performed by remote processing devices that are linked through a communications network. In a distributed computing environment, program modules may be located in both local and remote computer system storage media including memory storage devices.

FIG. 1 is a block diagram of exemplary computing apparatus for implementing ANN training methods embodying the invention in one embodiment. The computing apparatus is shown in the form of a general-purpose computer 1. The components of computer 1 may include processing apparatus such as one or more processors represented by processing unit 2, a system memory 3, and a bus 4 that couples various system components including system memory 3 to processing unit 2.

Bus 4 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer 1 typically includes a variety of computer readable media. Such media may be any available media that is accessible by computer 1 including volatile and non-volatile media, and removable and non-removable media. For example, system memory 3 can include computer readable media in the form of volatile memory, such as random access memory (RAM) 5 and/or cache memory 6. Computer 1 may further include other removable/non-removable, volatile/non-volatile computer system storage media. By way of example only, storage system 7 can be provided for reading from and writing to a non-removable, non-volatile magnetic medium (commonly called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can also be provided. In such instances, each can be connected to bus 4 by one or more data media interfaces.

Memory 3 may include at least one program product having one or more program modules that are configured to carry out functions of embodiments of the invention. By way of example, program/utility 8, having a set (at least one) of program modules 9, may be stored in memory 3, as well as an operating system, one or more application programs, other program modules, and program data. Each of the operating system, one or more application programs, other program modules, and program data, or some combination thereof, may include an implementation of a networking environment. Program modules 9 generally carry out the functions and/or methodologies of embodiments of the invention as described herein.

Computer 1 may also communicate with: one or more external devices 10 such as a keyboard, a pointing device, a display 11, etc.; one or more devices that enable a user to interact with computer 1; and/or any devices (e.g., network card, modem, etc.) that enable computer 1 to communicate with one or more other computing devices. Such communication can occur via Input/Output (I/O) interfaces 12. Also, computer 1 can communicate with one or more networks such as a local area network (LAN), a general wide area network (WAN), and/or a public network (e.g., the Internet) via network adapter 13. As depicted, network adapter 13 communicates with the other components of computer 1 via bus 4. Computer 1 may also communicate with accelerator apparatus 14, such as a GPU or FPGA, for accelerating training methods embodying the invention. It should be understood that although not shown, other hardware and/or software components could be used in conjunction with computer 1. Examples include, but are not limited to: microcode, device drivers, redundant processing units, external disk drive arrays, RAID systems, tape drives, and data archival storage systems, etc.

Figure 2:
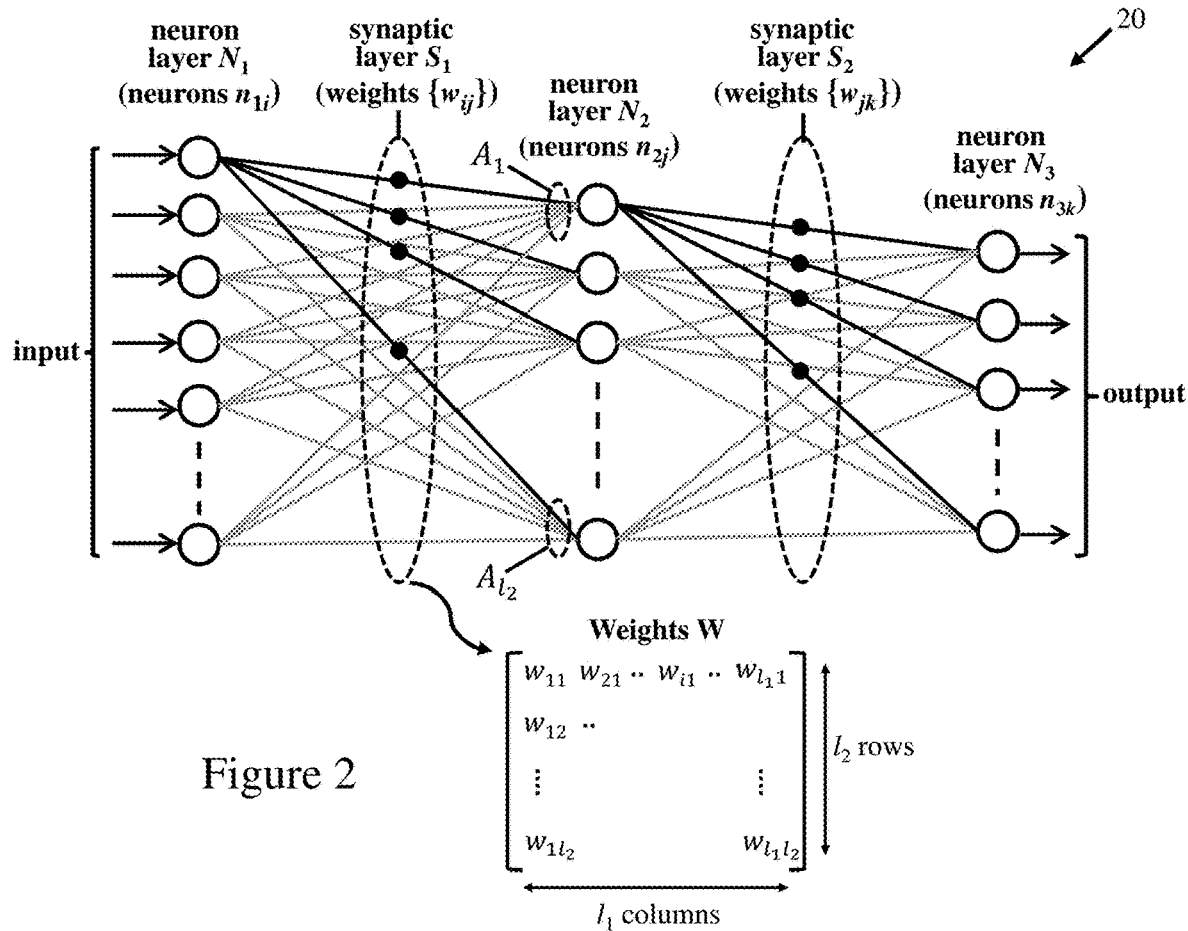
FIG. 2 is a schematic representation of a fully-connected ANN in one embodiment.

FIG. 2 shows the logical structure of one example of a fully-connected ANN. The ANN 20 comprises a succession of neuron layers with interposed synaptic layers. In the simple example shown, the network has three neuron layers: a first layer $N_1$ of input neurons which receive the input data signals; a last layer $N_3$ of output neurons which provide the output signals of the network; and an intermediate ("hidden") layer $N_2$ of neurons between the input and output layers. Neurons in layer $N_1$ are denoted here by $n_{1i} (1 \leq i \leq 1_1)$, neurons in layer $N_2$ are denoted by $n_{2j} (1 \leq j \leq 1_2)$, and neurons in layer $N_3$ are denoted by $n_{3k} (1 \leq k \leq 1_3)$, where $1_x$ is the number of neurons in layer $N_x$. All neurons in each layer are connected to all neurons in the next layer as indicated, whereby neuron activation signals from one layer are transmitted to neurons in the next layer. Synaptic layers $S_1$ and $S_2$, interposed with the neuron layers, store respective sets of weights $\{w_{ij}\}$ and $\{w_{jk}\}$ for weighting the signals propagated between their adjacent neuron layers. A weight $w_{ij}$ is defined for each connection between an $N_1$ neuron $n_{1i}$ and an $N_2$ neuron $n_{2j}$, whereby a signal propagated from $n_{1i}$ to $n_{2j}$ is weighted according to the corresponding weight $w_{ij}$ for that neuron pair. The set of weights $\{w_{ij}\}$ for synaptic layer $S_1$ can thus be represented by a matrix $W$ having $1_2$ rows and $1_1$ columns of weights $w_{ij}$ as indicated in the figure. A signal propagated by an $N_2$ neuron $n_{2j}$ to an $N_3$ neuron $n_{3k}$ is similarly weighted by a corresponding weight $w_{jk}$ of synaptic layer $S_2$, and the set of weights $\{w_{jk}\}$ for synaptic layer $S_2$ can be represented by a matrix having $1_3$ rows and $1_2$ columns of weights $w_{jk}$.

Input layer neurons may simply transmit their received input data signals as the activation signals for layer $N_1$. For subsequent layers $N_2$ and $N_3$, each neuron $n_{2j}, n_{3k}$ generates an activation signal dependent on its accumulated inputs, i.e. the accumulated weighted activation signals from its connected neurons in the previous layer. Each neuron applies a non-linear activation function $f$ to the result $A$ of this accumulation operation to generate its neuron activation signal for onward transmission. For example, the accumulated input $A_j$ to a neuron $n_{2j}$ is given by a dot product computation $A_j = \Sigma_{i=1}^{1_1}(w_{ij}x_{1i})$, where $x_{1i}$ is the activation signal from neuron $n_{1i}$. Computing the vector A of accumulated inputs $(A_1, A_2 \ldots A_{1_2})$ to neurons $n_{2j}$ can thus be represented by a matrix-vector multiplication $Wx$ between the matrix $W$ of weights $w_{ij}$ and the vector $x$ of activation signals $x_{1i} = (x_{11}, x_{12} \ldots x_{1l_1})$ from neurons $n_{1i}$. Each $N_2$ neuron $n_{2j}$ then generates its activation signal $x_{2j}$ as $x_{2j} = f(A_j)$ for propagation to layer $N_3$.

While a simple example of a fully-connected network is shown in FIG. 2, in general a neuron in any given layer may be connected to one or more neurons in the next layer, and networks may include one or more (commonly up to 30 or more) successive layers of hidden neurons. Neuron layers may include one or more bias neurons (not shown) which do not receive input signals but transmit bias signals to the next neuron layer. Other computations may also be associated with some ANN layers. In some ANNs, e.g. convolutional neural networks (CNNs), neuron layers may comprise three-dimensional volumes of neurons, with associated three-dimensional weight arrays in synaptic layers, though signal propagation computations can still be expressed in terms of matrix-vector operations.

ANN training involves an iterative process of signal propagation and weight-update calculation operations in response to a set of training examples which are supplied as inputs to the network. For each training example, the signal propagation operation comprises a forward propagation operation in which the training data is forward-propagated over the network, and a backpropagation operation in which error signals are back-propagated over the network. In the forward propagation operation, activation signals x are weighted and propagated, layer-by-layer, through the network as described above. For each neuron in the output layer, the output signal after forward propagation is compared with the expected output for the current training example to obtain an error signal c for that neuron. The error signals for the output layer neurons are backpropagated through all layers of the network except the input layer. Error signals backpropagated between adjacent neuron layers are weighted by the appropriate weights of the interposed synaptic layer. Backpropagation thus results in computation of error signals for each neuron layer except the input layer. Updates to the weights of each synaptic layer are then calculated based on the signals propagated by the neuron layers in the forward and backpropagation operations. For example, the update $\delta w_{ij}$ to a weight $w_{ij}$ between a neuron i in one layer and a neuron j in the next layer can be calculated as:

$$\delta w_{ij} = \eta x_i \varepsilon_j$$

where $x_i$ is the forward-propagated activation signal from neuron i; $\delta_j$ is the back-propagated error signal for neuron j; and η is a predefined learning parameter for the network. In general, weight updates may be calculated for some or all weights in a given iteration, and some or all weights may be updated after each iteration or after each training "epoch" in which a batch of training examples is processed. The training process thus progressively updates the network weights until the convergence condition is achieved, whereupon the resulting network, with trained weights, can be applied for ANN inference operations.

Figure 3:
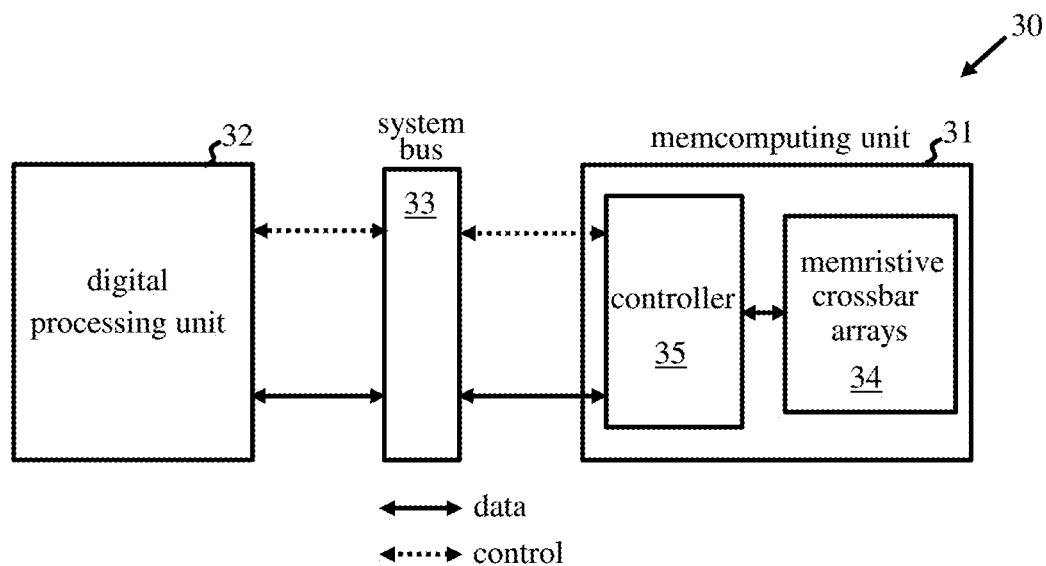
FIG. 3 is a schematic block diagram of ANN inference apparatus in one embodiment.

Embodiments of the invention provide methods for training weights of an ANN to be implemented by inference computing apparatus in which the trained weights are stored as programmed conductance states of predetermined memristive devices. An example of such inference computing apparatus is shown in FIG. 3. The apparatus 30 comprises a memcomputing unit 31 and a digital processing unit (DPU) 32 which is operatively coupled, here via a system bus 33, to memcomputing unit 31. The memcomputing unit 31 comprises a set of (one or more) memristive device arrays 34, and a controller 35 for controlling operation of the memcomputing unit. DPU 32 may be implemented by a general- or special-purpose computing apparatus, such as apparatus 1 of FIG. 1, programmed to control performance of inference operations in apparatus 30 in generally known manner In particular, the input data for an inference task is forward-propagated over the ANN layers, generally as described above, and the resulting network output indicates the inference result, e.g. a classification for the input data. The DPU 32 is adapted to generate the activation signals propagated by the neuron layers in this operation, and to determine the inference result from the network output. In this operation, the activation signals are supplied via bus 33 to memcomputing unit 31 where controller 35 supplies the signals to memristive device arrays 34. These arrays store the trained ANN weights and perform the weighting computations associated with synaptic layers of the network. The resulting signals are returned via bus 33 to DPU 32 which then generates the signals for propagation to the next layer.

Figure 4:
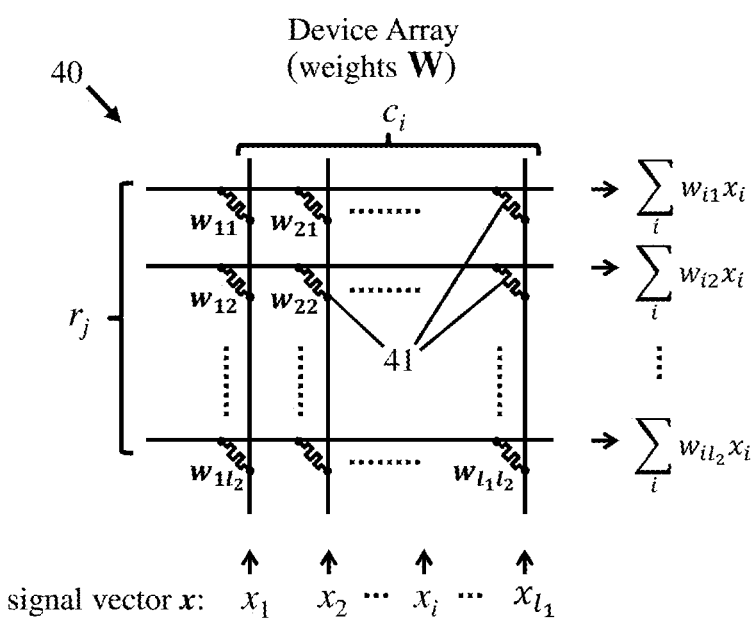
FIG. 4 illustrates structure of a memristive crossbar array in the FIG. 3 apparatus in one embodiment.

In memcomputing unit 31, the set of weights W for each synaptic layer is stored in an array 34 of memristive devices in which each device stores a respective weight w of the set. Such an array 34 is conveniently implemented by a crossbar array as shown in FIG. 4. This example shows a crossbar array 40 storing the weights matrix W for weights $\{w_{ij}\}$ of synaptic layer $S_1$ in the FIG. 2 ANN. Each memristive device 41 stores a respective weight $w_{ij}$ as a programmed conductance state of the device, whereby the weight corresponds to electrical conductance of the device. The devices 41 are arranged in logical rows and columns with each device connected between a particular row line and column line for application of signals to that device. In an inference operation, controller 35 supplies the activation signals $x_i$ to the column lines $c_i$ of the array. The resulting output signals on row lines $r_j$ correspond to weighted sums of the activation signals $\Sigma_i(w_{ij}x_i)$ as indicated. The array 40 thus implements the matrix-vector multiplication Wx in a power-efficient manner and with O(1) complexity.

Memristive devices 41 can be implemented in a variety of known ways, e.g. based on resistive memory cells such as phase-change memory (PCM) cells. These devices comprise one or more memory cells which can be arranged in various circuit configurations to store weights $w_{ij}$ in the programmable conductance state of the cells. The conductance state, and hence stored weight $w_{ij}$, can be varied in operation by application of programming signals to a device. In general, memristive devices 41 may be implemented by one or a plurality of PCM cells and/or other memristive memory elements, e.g. resistive memory cells such as resistive RAM (RRAM, or ReRAM) cells including conductive bridge RRAM cells, oxide or metal-oxide RRAM cells, carbon RRAM cells, and magneto-resistive random access memory (MRAM) elements, ferroelectric random access memory (FeRAM) elements, optical memory elements, as well as circuit devices, e.g. CMOS circuits, comprising SRAM, DRAM, transistors, resistors, capacitors, and/or inductors, which emulate behavior of memristive elements.

ANN weights can be encoded as programmed conductance states of memristive devices in various ways, e.g. by mapping particular weight values, or ranges of values, to particular programmed states defined by target conductance values or ranges of conductance values of a device. However, storing digital weights in memristive device arrays is an imprecise process due to the loss of digital precision and conductance errors arising from various causes including write (programming) and read stochasticity. If G is the conductance of a memristive device, when programming the device to a target state with conductance $G_T$, there is a conductance error of $\Delta G$, i.e. a subsequent measurement of device conductance will retrieve the value $G_T+\Delta G$. The error $\Delta G$ is a random variable which accommodates the effect of write noise and read noise. The distribution of $\Delta G$ can depend on many factors such as $G_T$, memristive device type, time, and environmental conditions.

Figure 5:
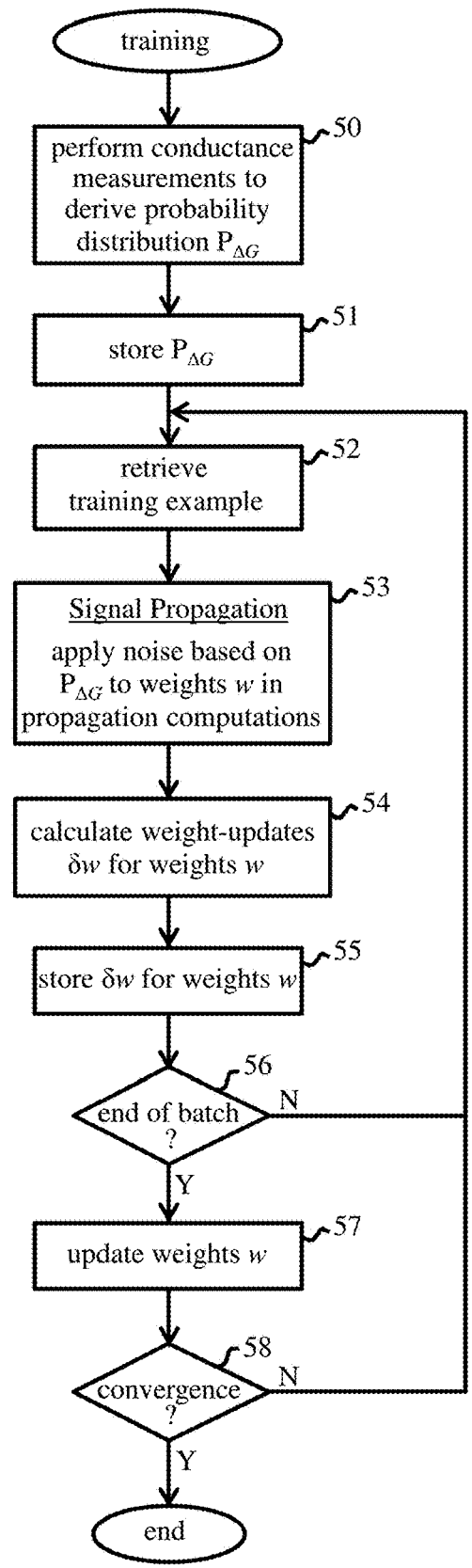
FIG. 5 indicates steps of a training method embodying the invention in one embodiment.

In training methods embodying the invention, the ANN weights to be stored in memristive devices of an inference apparatus are trained in digital computing apparatus via a process which addresses the above issue. FIG. 5 indicates basic steps in an embodiment of the training method. In step 50, measurements are performed on test memristive devices, here of the predetermined type to be used in the inference apparatus, to derive a probability distribution $P_{\Delta G}$. The distribution $P_{\Delta G}$ indicates distribution of conductance errors $\Delta G$ for these devices in the programmed conductance states to be used for weight storage. The distribution $P_{\Delta G}$ is stored in digital computing apparatus 1 in step 51. The apparatus 1 then implements an ANN training process to train the weights of the ANN to be implemented by inference apparatus 30. Training is performed via an iterative training process, generally as described above, in which the ANN weights are repeatedly updated in response to processing by the network of training data which is propagated over the network via the weights. However, during training, apparatus 1 applies noise dependent on the probability distribution $P_{\Delta G}$ to weights used in the iterative training process.

Steps 52 to 58 indicate the training process which begins with ANN weights set to initial values for the training operation. In step 52, apparatus 1 retrieves a training example from a training dataset stored in memory 3. Step 53 represents the signal propagation operation in which the training data is forward propagated, and error signals are backpropagated, generally as described above. Noise Δw, dependent on the distribution $P_{\Delta G}$, is applied to weights w used in the signal propagation computations of this step. In general, noise may be applied to some or all weights w, and on some or all occasions the weights are used, as discussed further below. In step 54, weight-updates δw are calculated for weights w as described above. In this embodiment, the ANN weights are updated at the end of each training epoch in which a batch of training examples is processed. The weight-updates δw for weights w are therefore stored by apparatus 1 in step 55. In decision step 56, the apparatus determines if all training examples for the current batch have been processed. If not ("N" at step 56), operation reverts to step 52 for the next training example. When processing of the current batch is complete ("Y") at step 56, operation proceeds to step 57 in which the network weights w are updated based on the weight-updates δw stored for respective weights in step 55. In decision step 58, the apparatus 1 determines if a predetermined convergence condition for the training operation has been achieved. (Convergence can be defined in various known ways, and the particular convergence condition is orthogonal to the operation described herein). If not, operation reverts to step 52 for the next training epoch. The training operation terminates when convergence is detected at step 58.

Figure 6:
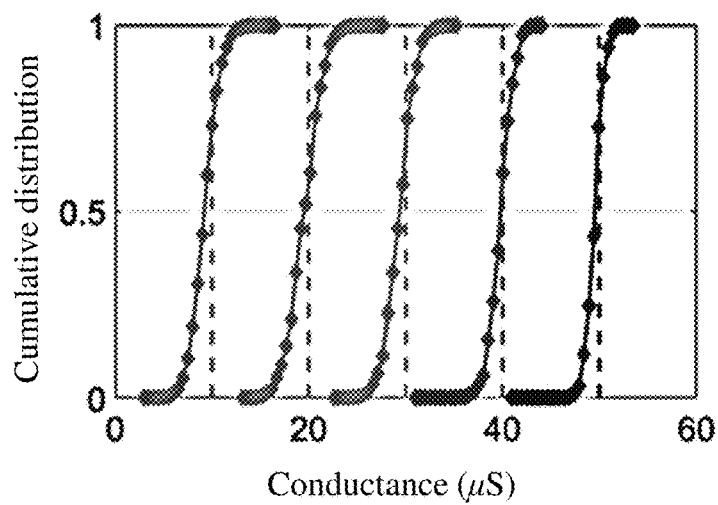
FIG. 6 illustrates results of conductance measurements for PCM devices in different programmed conductance states in one embodiment.
Figure 7:
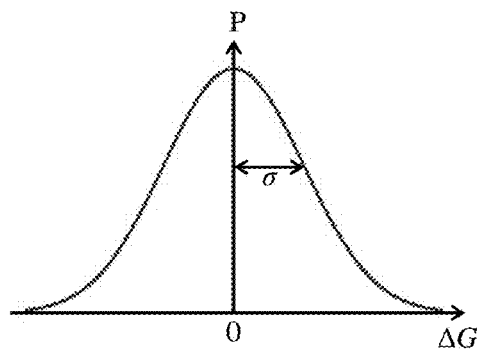
FIG. 7 shows a Gaussian probability distribution representing conductance errors in memristive devices in one embodiment.

To derive the probability distribution $P_{\Delta G}$, multiple measurements may be performed on multiple memristive devices programmed to different conductance states. FIG. 6 illustrates cumulative probability distributions obtained by programming 50,000 PCM devices to five different conductance levels, with 10,000 devices per level. Conductance of each device was read approximately 50 µs after programming Vertical dashed lines show the target conductance $G_T$ for each state. The distribution of conductance errors $\Delta G$ for each state typically correspond to a Gaussian distribution, illustrated in FIG. 7, for probability P vs. $\Delta G$, with a defined standard deviation 6. The probability distribution $P_{\Delta G}$ derived in step 50 of FIG. 5 may comprise the measured distribution per se, or a Gaussian or other standard distribution function which fits measurements for a given device type. Measurements can be made for devices in predetermined programmed states used for weight-storage in the inference apparatus. The distribution $P_{\Delta G}$ may comprise a set of probability distribution functions, one for each programmed state, or a single distribution may be defined from measurements for all states, e.g. as a Gaussian with standard deviation corresponding to the largest value of 6 for the distributions of individual states. Where the inference apparatus uses a set of crossbar device arrays as described above, the conductance measurements may be performed on such a crossbar array so that the error distribution is derived for the same type of device and array configuration. The distribution $P_{\Delta G}$ may also accommodate additional factors, described below, in embodiments.

The device measurements for derivation of $P_{\Delta G}$ may be performed offline prior to training or may be performed by computing apparatus 1, e.g. by interaction with a memcomputing unit as in the configuration shown in FIG. 3. In any case, the resulting distribution stored in step 51 of FIG. 5 provides a conductance-error profile for the memristive devices of the inference apparatus, and this is used to determine the weight noise applied in step 53 of the training process. In this embodiment, noise is applied to a weight w by adding a noise sample $\Delta w = \alpha \Delta G$ where $\Delta G$ is a conductance error sampled from the probability distribution $P_{\Delta G}$ and $\alpha$ is a scaling factor. The value of $\Delta w$ may thus be positive or negative according to the sign of $\Delta G$. An appropriate value for $\alpha$ can be determined based on conductance values of the memristive devices and the weight values in the iterative training process, and may differ for weights in different ANN layers. For example, an upper limit c may be predefined for values of weights in the set of weights for each layer. This limit may be defined by pretraining the network as discussed below, or by constraining weights in each layer to a predefined range, with weights being clipped as necessary to enforce this constraint during training. A noise sample $\Delta w = \alpha \Delta G$ may then be computed using $\alpha = c/G_{max}$, where $G_{max}$ is a maximum conductance value for the memristive devices. By way of example, for memristive devices which comprise a pair of memristive elements in a differential configuration (in which conductance of one element represents a positive weight value and conductance of the other represents a negative weight value), each device spans an effective conductance range $-G_{max}$ to $G_{max}$. Weights may be constrained to a range $-c$ to c to accommodate the limited conductance range of the devices. Hence, for devices with $G_{max}$=50 µS and a conductance-error distribution $P_{\Delta G}$ represented by a Gaussian with σ=4 µS, then for weights w clipped to a range $-0.3$ to 0.3 for a given layer the weight noise $\Delta w$ can be sampled from a Gaussian with σ=(0.6×4/100)=0.024. The resulting weight value (w+$\Delta w$) is then used for the weight w in step 53 of training process.

As weight-ranges typically expand during training, use of the same weight-range c throughout training may result in early epochs seeing more weight-noise (relative to their scale) than later epochs. This can be addressed by using an adaptive weight-range for the noise calculation. In particular, the scaling factor $\alpha$ for noise samples $\Delta w = \alpha \Delta G$ can be computed using $\alpha = f(W)/G_{max}$, where f(W) is a predetermined function of current weight values in the set of weights W for a given ANN layer. For example, f(W)=max(W) may be used, where max(W) is the largest entry in the weights matrix W. As another example, f(W)=k$\sigma_w$ may be used where $\sigma_w$ is the standard deviation of the distribution of weights in W and k is some constant. Another example for f(W) may be a particular percentile, e.g. $95^{th}$ percentile, of the entries in W.

To simplify processing in some embodiments, noise may be applied to weights w used in the forward propagation operation only. In other embodiments, the same noise may be applied to a given weight w in the forward and back-propagation operations of a given iteration of the training process. Noise $\Delta w$ is thus sampled once for each weight w in each iteration. In embodiments, the noise $\Delta w$ applied in the backpropagation operation is independent of that applied in the forward propagation operation, whereby noise is independently sampled for each weight w in each propagation operation.

It will be seen that the above training scheme applies random noise to weights based on conductance errors sampled in accordance with the probability distribution $P_{\Delta G}$ for the memristive devices of the inference apparatus. In this way, the training process is adapted to accommodate conductance errors inherent in the memristive devices, enhancing performance of inference apparatus programmed with the trained weights.

In embodiments where $P_{\Delta G}$ is a function of programmed conductance state $G_T$ of the memristive devices, the noise $\Delta w$ applied to a weight w may be dependent on a particular programmed conductance state corresponding to that weight. For example, the overall conductance-error profile $P_{\Delta G}$ may comprise a probability distribution function (PDF) for each programmed conductance state $G_T$. (Such PDFs may be derived from measurements for a discrete set of conductance states, with interpolation if necessary for any intervening states used for weight storage). Particular weight values or ranges of values may be mapped to respective conductance values $G_T$, e.g. by dividing the weight range $-c$ to c for a layer into a number of sub-ranges corresponding to a number of programmed conductance states $G_T$. Noise $\Delta w$ applied to a given weight w can then be sampled based on the probability distribution for the state $G_T$ corresponding to that weight.

Figure 8:
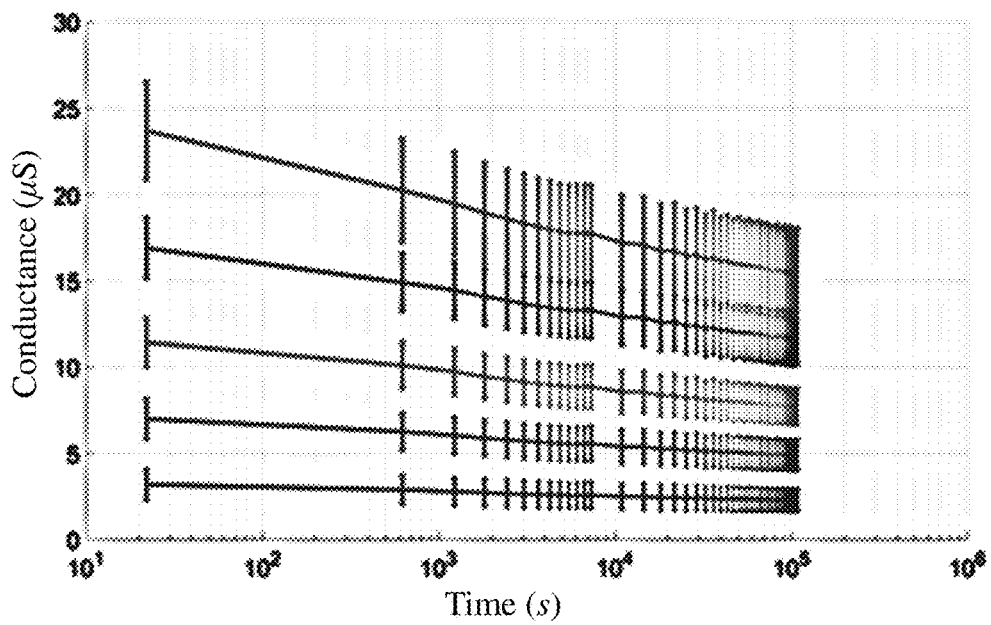
FIG. 8 illustrates time-dependence of the conductance of PCM devices in different programmed conductance states in one embodiment.

In embodiments, the probability distribution $P_{\Delta G}$ is a function of time to accommodate time-dependent conductance variations. For example, memristive devices such as PCM devices exhibit conductance drift which is expressed as an exponential decay in conductance over time: $G(t)=G(t_0) \times (t/t_0)^{-v}$, where $G(t)$ is conductance at time t, $t_0$ is some initial time instant, and v is a coefficient of drift which varies with factors such as current device conductance. This degradation of conductance over time can significantly affect performance of a neural network implemented with memristive synapses. Smaller conductance values are affected more severely by drift, and added read noise can render their value unrecoverable if this is not addressed. Some embodiments therefore measure time-dependence of device conductance in deriving the conductance-error profile $P_{\Delta G}$. FIG. 8 provides an illustrative example. This shows evolution of mean conductance over time for the cumulative distributions of FIG. 6. The vertical bars indicate standard deviation of the measurements for each state. A probability distribution $P_{\Delta G}(G_T, t)$ which is a function of target conductance level $G_T$ and time t can thus be defined for these devices.

To accommodate time-dependent distributions in the training process, a time distribution for operation of the inference apparatus is defined in the digital computing apparatus 1. In particular, a time probability distribution μ is defined over the set of real positive numbers $\mathbb{R}^+$ representing the time range of operation for inference. For example, if operation is over a time interval $[t_{min}, t_{max}]$, μ may be chosen as the uniform distribution over that interval. (In general, however, u does not need to be uniform. Some time periods might be more important than others. For instance, it might be more important that the apparatus works well in the interval from 0 s to 10 s, and less important that it works from 10 s to 20 s, and the distribution μ can be defined accordingly). In the training process of FIG. 5, noise is then applied to a weight by sampling a time from the time distribution μ, and applying noise Δw dependent on the probability distribution $P_{\Delta G}(t)$ at the sampled time. To simplify processing, time may be sampled here once for each training batch. However, time could be sampled for each training example, or for each weight, weight-set or subset thereof if desired.

In general, the distribution of conductance errors ΔG depends on many factors including memristor device type, precision of iterative programming methods, time since programming, device degradation after prolonged operation, and environmental factors such as temperature variations. In some embodiments, the conductance measurements used to derive $P_{\Delta G}$ are performed on devices in a test environment which provides a set of environmental conditions present in an operating environment of the inference computing apparatus. The resulting distribution $P_{\Delta G}$ thus provides an application-dependent profile which is tailored to operating conditions of the inference apparatus. A test environment may be designed to simulate temperature, pressure and/or motion conditions (e.g. vibrations/shocks), or any other conditions which may affect memristive device operation. A probability distribution $P_{\Delta G}(G_T, t)$ can thus capture all relevant information about the memristive device dynamics, including effects of the operating environment, and the time-dependence thereof. As an illustrative example, if an ANN inference chip will operate inside a car engine which exposes the circuitry to a sinusoidal temperature variation over time, the effect of this temperature variation can be captured in the profile $P_{\Delta G}(G_T, t)$. Training ANN weights based on distributions tailored to a particular application scenario provides exceptional accuracy during inference.

In some embodiments, derivation of the probability distribution $P_{\Delta G}$ may comprise at least some degree of modelling. For example, conductance measurements for one type of memristive device could be used to model behaviour of other, similar or related, devices in the inference apparatus. As particular example, where devices in the inference apparatus include a plurality of memristive elements, measurements could be performed for the individual elements and used to model the effect in composite devices. Modelling could be used to adjust for devices of difference sizes or to accommodate characteristics due to particular circuit configurations in the inference apparatus. Modelling might also be used to account for certain features, such as aspects of time dependence, which it is not feasible to fully characterize by measurement alone. An example here is where an inference apparatus will operate over a longer period, e.g. several years, than can be accommodated in measurements.

With the training process of FIG. 5, the ANN weights are efficiently trained with digital precision in apparatus 1, while accommodating conductance variations for the memristive devices in the inference apparatus. In some embodiments, the ANN weights w may be stored in full digital precision in apparatus 1, with clipping (if necessary) and weight noise Δw applied to the full-precision weights used in training. After training, weights w in the continuous weight-range −c to c for each layer can be mapped to analog conductance states $G_T$ in $-G_{max}$ to $G_{max}$. If a discrete set of programmed conductance states $G_T$ is used in the inference apparatus, weights w in −c to c can be mapped to states $G_T$ by sub-dividing the range −c to c into n intervals where n is the number of discrete states $G_T$. In embodiments with adaptive weight-ranges described above, c can be set to max(W) at the end of training. The memristive arrays of the inference apparatus are then programmed accordingly to store the weight-sets for each layer.

Figure 9:
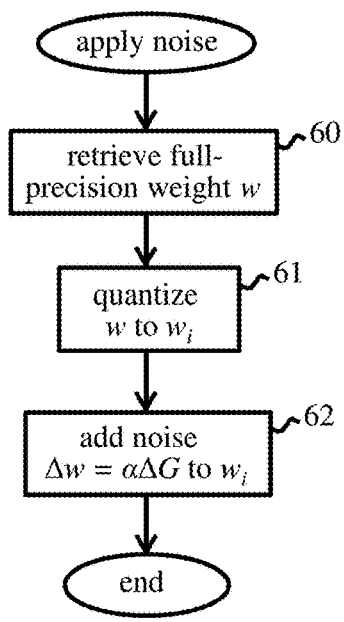
FIG. 9 indicates steps involved in applying weight noise in an embodiment of the invention.

In other embodiments, a set of quantized weight values $w_1, w_2, w_i, \ldots, w_n \in [-c, c]$ may be defined in apparatus 1. These quantized weight values correspond to respective programmed conductance states $G_1, G_2, G_n \in G_{ran}$d with associated conductance-error distributions $P_{\Delta G}(G_i)$. In the training process, weights can then be quantized to values $w_1, \ldots, w_n$ and noise Δw applied to the quantized weight values for propagation computations. FIG. 9 indicates steps of the weight-noise application in one example of this process where the weights w are stored in full precision. In step 60 here, apparatus 1 retrieves a full-precision weight value w. In step 61, the full precision weight w is quantized to a weight value $w_i$, e.g. by deterministic or stochastic rounding. In step 62, noise $\Delta w = \alpha \Delta G_1$ is calculated based on a $P_{\Delta G}(G_i)$ and added to the quantized weight w, used in computations (step 53 of FIG. 5). The weight-update Δw can then be calculated in full precision in step 54 of FIG. 5, and the full-precision weight w updated accordingly in step 57 of FIG. 5.

Figure 10:
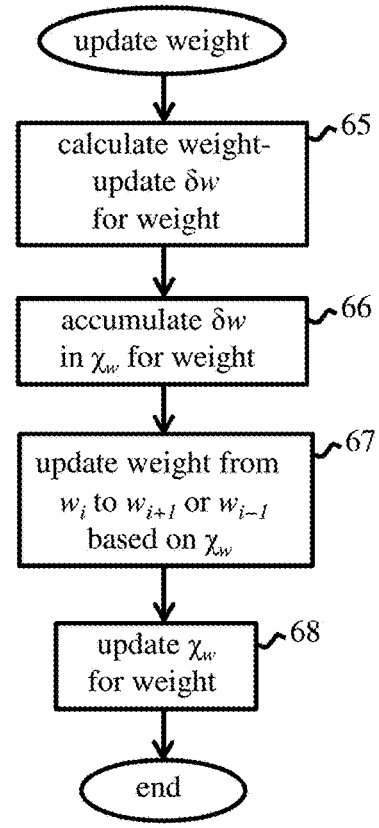
FIG. 10 indicates steps of a weight-update procedure in an embodiment of the invention.

In an alternative to the FIG. 9 embodiment, ANN weights quantized to values $w_1, \ldots, w_n$ may be stored in apparatus 1, e.g. in a low-precision fixed point format. The quantized weight values $w_i$, with added weight noise $\Delta w = \alpha \Delta G_i$, are used in propagation computations in step 53 of FIG. 5. FIG. 10 indicates steps of the weight-update procedure for a quantized weight $w_i$, in this embodiment. In step 65, a weight-update δw is calculated in full precision as in step 54 of FIG. 5. In step 66, the updates δw for a weight are accumulated over the current training batch in a full-precision accumulator variable $\chi_w$ stored in apparatus 1 for that weight. In step 67, the quantized weight $w_i$, can be updated to $w_{i+1}$ or $w_{i-1}$ if the accumulator value $\chi_w$ is greater than $(w_{i+1} - w_i)$ or less than $(w_{i-1} - w_i)$ respectively. After updating the weight, the accumulator value $\chi_w$ is updated accordingly in step 68. The residual accumulated weight-update is thus retained in full-precision in the variable $\chi_w$, whereby no weight-update information is lost through quantization. After training, the quantized trained weights $w_i$ are stored in memristive arrays of the inference apparatus by programming devices to the corresponding states $G_i$.

For analog memristive devices, the possible conductance states form a continuous range and may therefore be chosen as desired. In some embodiments, equidistant conductance states may be used, i.e.: $G_1 = -G_{max}$, $G_n = G_{max}$; $G_{i+1} - G_i =$ constant for all i. In some embodiments, the states can be defined for minimal conductance overlap, i.e., by choosing $G_1, G_2, \ldots, G_n$ such that overlap of the probability distribution functions of the random variables $X_i = G_i + \Delta G(G_i)$ for $i = 1, \ldots, n$ is minimized. For memristive devices which use a quantized set of states (e.g. devices based on the known multimemristive algorithm), training with quantized weights is employed as described above to accommodate the discrete nature of the memristive devices.

Figure 11:
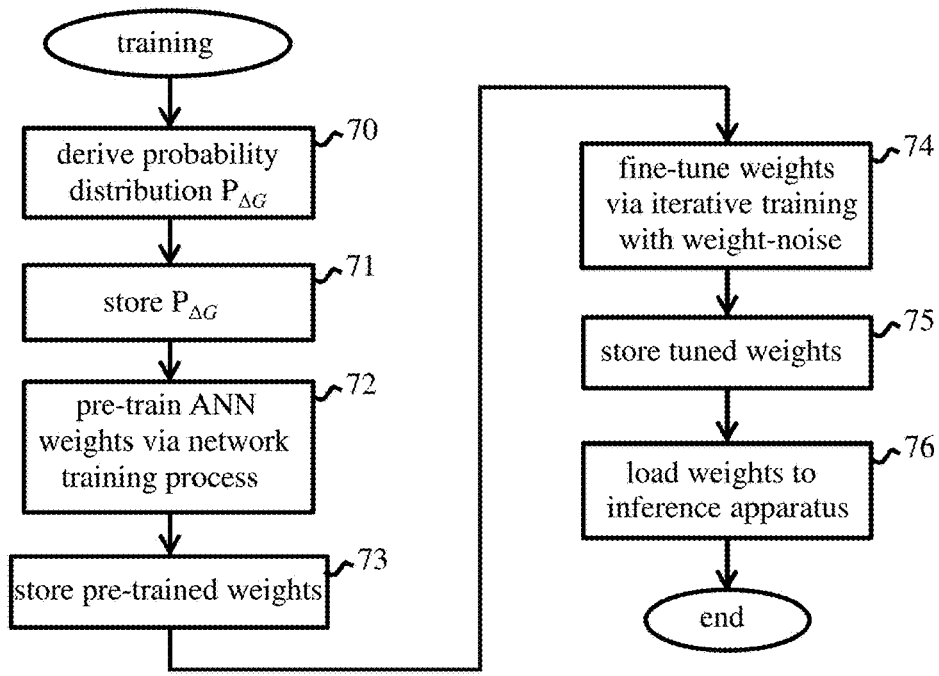
FIG. 11 indicates steps of a training method embodying the invention in one embodiment.

Training accuracy can be increased by performing a method described above as a fine-tuning stage of a network training process. The overall training method is then as illustrated in FIG. 11. Steps 70 and 71 here correspond to steps 50 and 51 of FIG. 5. In step 72, the ANN weights are pre-trained in apparatus 1 via a standard network training process, without applying weight-noise to the weights. The resulting pre-trained weights are stored in step 73. These weights provide the initial weight values for the further training process of step 74 in which weight-noise is applied to weights as described above. The resulting fully-trained weights are stored in step 75 and can then be loaded to (multiple instances of) the inference apparatus as indicated at step 76.

Figure 12:
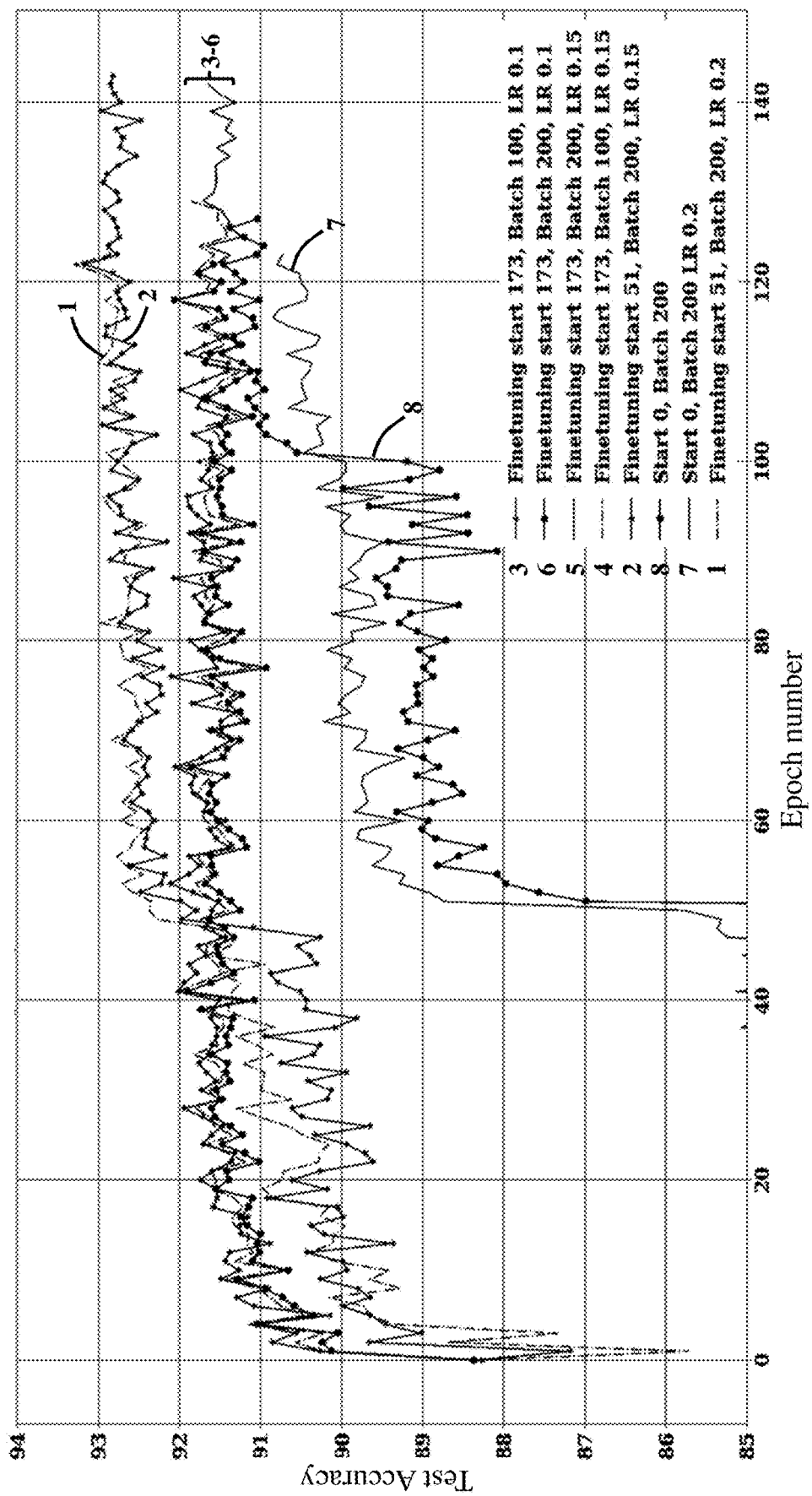
FIG. 12 illustrates inference results for training methods embodying the invention in one embodiment.

Network performance can be improved by using a larger batch size in the fine-tuning process of step 74 than in the pre-training of step 72. Performance can also be enhanced by choosing the initial learning rate η (for calculation of weight-updates $\delta w = \eta \times \varepsilon$) for fine-tuning step 74 based on initial performance of the pretrained network for inference. Observing this performance facilitates selection of an appropriate learning rate for fine-tuning step 74 based on the learning rate vs. training epoch profile in pre-training step 72. The effect of batch size and learning rate on fine-tuning is illustrated in FIG. 12. This shows accuracy (%) of inference results after fine-tuning of a 32-layer deep convolutional neural network (CNN) with additive weight-noise and adaptive weight-range in training. Traces 1 to 8 are labelled "Finetuning start xx" corresponding to different learning rates ("LR") and learning rate decay parameters as well as different batch sizes ("Batch"). Traces 1 and 2 (with initial learning rates of 0.2 and 0.15 respectively, and batch size 200) give the best results. "Start 0" indicates training is from scratch (i.e. no pre-training step 72 in FIG. 12) and demonstrates that pre-training gives better performance.

Embodiments described above offer exceptional accuracy in training ANNs for implementation in inference apparatus using memristive devices for weight storage. Network accuracy can be achieved on the inference hardware which is exactly the same as accuracy of the trained digital network.

Numerous changes and modifications can of course be made to the exemplary embodiments described. For example, instead of additive weight-noise as described above, multiplicative noise could be applied to weights. Also, different probability distributions $P_{\Delta G}$ may be derived for different time periods, associated with different environmental conditions, in operation of an inference apparatus. Different weight-sets may be trained for the various operating periods, and the appropriate weights can then be programmed to device arrays of the inference apparatus at the start of each operating period. An example here is where an ANN inference chip is to operate in a day/night cycle. Due to temperature variations, different conductance error profiles, and hence different weight-sets, will be obtained for day and night operation and the inference apparatus can then re-program the device arrays with the appropriate weight-set at the start of each 12-hour period.

As another example, weight-noise training may be performed incrementally for different ANN layers to improve convergence speed. The network can be split into N blocks $\{B_1, \ldots, B_N\}$ each containing the same number of consecutive layers. The budget of training epochs is also split into N stages. At the $i^{th}$ stage: the weights of blocks $B_1, \ldots, B_{i-1}$ (with weight-noise applied) are frozen; the weights of blocks $B_i, \ldots, B_N$ are then trained with weight-noise applied to weights of block $B_i$ (but not to weights of subsequent blocks).

Various additional features may be incorporated in training processes embodying the invention. Additional pre-training stages may be performed between steps 73 and 74 of FIG. 11. For example, the network can be pre-trained for sparsity to suppress small weight values in generally known manner Small magnitude weights may be clipped to a threshold value, or masked to zero, in this process. Pre-training processes may also use known techniques to accommodate distribution of defective devices in memristive arrays.

In general, where features are described herein with reference to a method embodying the invention, corresponding features may be provided in a computer program product embodying the invention, and vice versa.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for training weights of an artificial neural network to be implemented by inference computing apparatus in which the trained weights are stored as programmed conductance states of respective predetermined memristive devices, the method comprising:
   deriving for said memristive devices a probability distribution indicating distribution of conductance errors for said devices in said programmed conductance states;
   in a digital computing apparatus, training said weights via an iterative training process in which the weights are repeatedly updated in response to processing by the network of training data which is propagated over the network via the weights; and
   in the digital computing apparatus, applying noise dependent on said probability distribution to weights used in said iterative training process.

2. A method as claimed in claim 1 including performing conductance measurements on test memristive devices and deriving said probability distribution from said conductance measurements.

3. A method as claimed in claim 2 wherein said conductance measurements are performed on said predetermined memristive devices in said programmed conductance states.

4. A method as claimed in claim 3 wherein the inference computing apparatus comprises a set of crossbar arrays of said predetermined memristive devices, and wherein said conductance measurements are performed on a said crossbar array of memristive devices.

5. A method as claimed in claim 2 including performing said conductance measurements on the test devices in a test environment providing a set of environmental conditions present in an operating environment of said inference computing apparatus.

6. A method as claimed in claim 5 wherein said set of environmental conditions comprises at least one of temperature, pressure and motion conditions.

7. A method as claimed in claim 1 wherein said probability distribution is a function of programmed conductance state of said memristive devices, and wherein noise applied to a weight in said iterative training process is dependent on a said programmed conductance state corresponding to that weight.

8. A method as claimed in claim 1 wherein said probability distribution is a function of time, the method including:
defining in said digital computing apparatus a time distribution for operation of the inference computing apparatus; and
applying noise to a weight in said iterative training process by sampling a time from said time distribution and applying noise dependent on said probability distribution at the sampled time.

9. A method as claimed in claim 1 wherein noise is applied to a weight in said iterative training process by adding a noise sample $\Delta w = \alpha \Delta G$ where $\Delta G$ is a conductance error sampled from said probability distribution and $\alpha$ is a scaling factor.

10. A method as claimed in claim 9 wherein said weights comprise a plurality of sets of weights associated with respective layers of the network, and wherein the noise sample $\Delta w = \alpha \Delta G$ added to a weight w is computed using $\alpha = c/G_{max}$, where c is a predefined upper limit for values of weights in the set of weights containing w and $G_{max}$ is a maximum conductance value for said memristive devices.

11. A method as claimed in claim 9 wherein said weights comprise a plurality of sets of weights associated with respective layers of the network, and wherein the noise sample $\Delta w = \alpha \Delta G$ added to a weight w in a set of weights W is computed using $\alpha = f(W)/G_{max}$ where f(W) is a predetermined function of current weight values in the set W.

12. A method as claimed in claim 1 wherein each iteration of said iterative training process comprises a forward propagation operation, in which training data is forward-propagated over the network, and a backpropagation operation in which error signals are back-propagated over the network, the method including applying said noise to weights used in the forward propagation operation.

13. A method as claimed in claim 12 including applying said noise to weights used in the backpropagation operation, wherein the noise applied to a weight w in the backpropagation operation of a said iteration is the same as that applied to the weight w in the forward propagation operation of that iteration.

14. A method as claimed in claim 12 including applying said noise to weights used in the backpropagation operation, wherein the noise applied to a weight w in the backpropagation operation of a said iteration is independent of that applied to the weight w in the forward propagation operation of that iteration.

15. A method as claimed in claim 1 including, in the digital computing apparatus, storing said weights in full-precision and applying said noise to the full-precision weights.

16. A method as claimed in claim 1 including, in the digital computing apparatus:
defining quantized weight values corresponding to respective programmed conductance states of said memristive devices; and
in said iterative training process, quantizing said weights to said quantized weight values and applying said noise to the quantized weight values.

17. A method as claimed in claim 1 including, in the digital computing apparatus:
pre-training the weights via a network training process, without applying said noise to the weights, to obtain pre-trained weights for the network; and
further training the pre-trained weights via said iterative training process in which said noise is applied to the weights.

18. A method as claimed in claim 1 including, after training the weights, storing the trained weights in respective memristive devices of said inference computing apparatus by programming the devices to programmed conductance states corresponding to the respective weights.

19. A computer program product for training weights of an artificial neural network to be implemented by inference computing apparatus in which the trained weights are stored as programmed conductance states of respective predetermined memristive devices, said computer program product comprising a computer readable storage medium having program instructions embodied therein, the program instructions being executable by digital computing apparatus to cause the digital computing apparatus to:
store a probability distribution derived for said memristive devices, the probability distribution indicating distribution of conductance errors for said devices in said programmed conductance states;
train said weights via an iterative training process in which the weights are repeatedly updated in response to processing by the network of training data which is propagated over the network via the weights; and
apply noise dependent on said probability distribution to weights used in said iterative training process.

20. A computer program product as claimed in claim 19 wherein said probability distribution is a function of time, said program instructions being further executable to cause the digital computing apparatus to:
store a time distribution for operation of the inference computing apparatus; and
apply noise to a weight in said iterative training process by sampling a time from said time distribution and applying noise dependent on said probability distribution at the sampled time.

* * * * *